(12) United States Patent
Takeda

(10) Patent No.: US 10,774,421 B2
(45) Date of Patent: Sep. 15, 2020

(54) SEMICONDUCTOR DEVICE MANUFACTURING METHOD, SUBSTRATE PROCESSING APPARATUS AND RECORDING MEDIUM

(71) Applicant: HITACHI KOKUSAI ELECTRIC INC., Tokyo (JP)

(72) Inventor: Tsuyoshi Takeda, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/458,294

(22) Filed: Mar. 14, 2017

(65) Prior Publication Data

US 2017/0268105 A1 Sep. 21, 2017

(30) Foreign Application Priority Data

Mar. 18, 2016 (JP) .................................. 2016-055364

(51) Int. Cl.
*C23C 16/455* (2006.01)
*C23C 16/507* (2006.01)
(Continued)

(52) U.S. Cl.
CPC ...... *C23C 16/45536* (2013.01); *C23C 16/401* (2013.01); *C23C 16/45531* (2013.01);
(Continued)

(58) Field of Classification Search
CPC ... H01L 21/67098; H01L 21/67–68792; C23C 16/45531–45578
See application file for complete search history.

(56) References Cited

U.S. PATENT DOCUMENTS 5,435,880 A * 7/1995 Minato ................. C23C 16/507
118/723 I
2002/0007793 A1 1/2002 Sakai et al.
(Continued)

FOREIGN PATENT DOCUMENTS

CN 102522310 A 6/2012
JP 02159027 H 6/1990
(Continued)

OTHER PUBLICATIONS

Korean Office Action dated Mar. 12, 2018 for the Korean Patent Application No. 10-2017-0027781.
(Continued)

*Primary Examiner* — Stephen M Bradley
(74) *Attorney, Agent, or Firm* — Volpe and Koenig, P.C.

(57) ABSTRACT

A substrate processing apparatus includes: a reaction tube with a process chamber defined therein, the process chamber being configured to process a substrate; a heating device configured to heat the process chamber; a gas supply part configured to supply a process gas used in processing the substrate; and a plasma generating part including an electrode composed of a first electrode portion connected to a high frequency power supply and a second electrode portion grounded to the earth, which are installed to surround the entire circumference of an outer wall of the reaction tube. An inter-electrode distance between the first electrode portion and the second electrode portion is determined by at least a frequency of the high frequency power supply and a voltage applied across the electrode. The first and second electrode portions are installed based on the determined inter-electrode distance.

8 Claims, 7 Drawing Sheets

(51) Int. Cl.
*C23C 16/40* (2006.01)
*C23C 16/46* (2006.01)
*C23C 16/505* (2006.01)
*C23C 16/52* (2006.01)
*H01L 21/02* (2006.01)

(52) U.S. Cl.
CPC .. *C23C 16/45542* (2013.01); *C23C 16/45546* (2013.01); *C23C 16/45578* (2013.01); *C23C 16/46* (2013.01); *C23C 16/505* (2013.01); *C23C 16/507* (2013.01); *C23C 16/52* (2013.01); *H01L 21/0228* (2013.01); *H01L 21/02164* (2013.01); *H01L 21/02211* (2013.01); *H01L 21/02219* (2013.01); *H01L 21/02274* (2013.01)

(56) References Cited

U.S. PATENT DOCUMENTS

| | | | | |
|---|---|---|---|---|
| 2007/0157882 A1* | 7/2007 | Ozaki | ............... | H01L 21/0223 118/715 |
| 2008/0003702 A1* | 1/2008 | Cruse | ............... | H01L 21/67069 438/7 |
| 2009/0061651 A1* | 3/2009 | Nakashima | ........... | C23C 16/345 438/791 |
| 2009/0137128 A1* | 5/2009 | Ko | ................... | H01J 37/32009 438/710 |
| 2011/0097823 A1* | 4/2011 | Tsuda | ..................... | C23C 16/24 438/5 |
| 2013/0284721 A1* | 10/2013 | Yang | ....................... | H05B 3/12 219/553 |

FOREIGN PATENT DOCUMENTS

| | | |
|---|---|---|
| JP | 2001-338885 A | 12/2001 |
| JP | 4838552 B2 | 12/2011 |
| KR | 20090025171 A | 3/2009 |
| WO | 2006/118215 A1 | 11/2006 |
| WO | 2009/145068 A1 | 12/2009 |

OTHER PUBLICATIONS

Chinese Office Action dated May 31, 2018 for the Chinese Patent Application No. 201710063648.7.

* cited by examiner

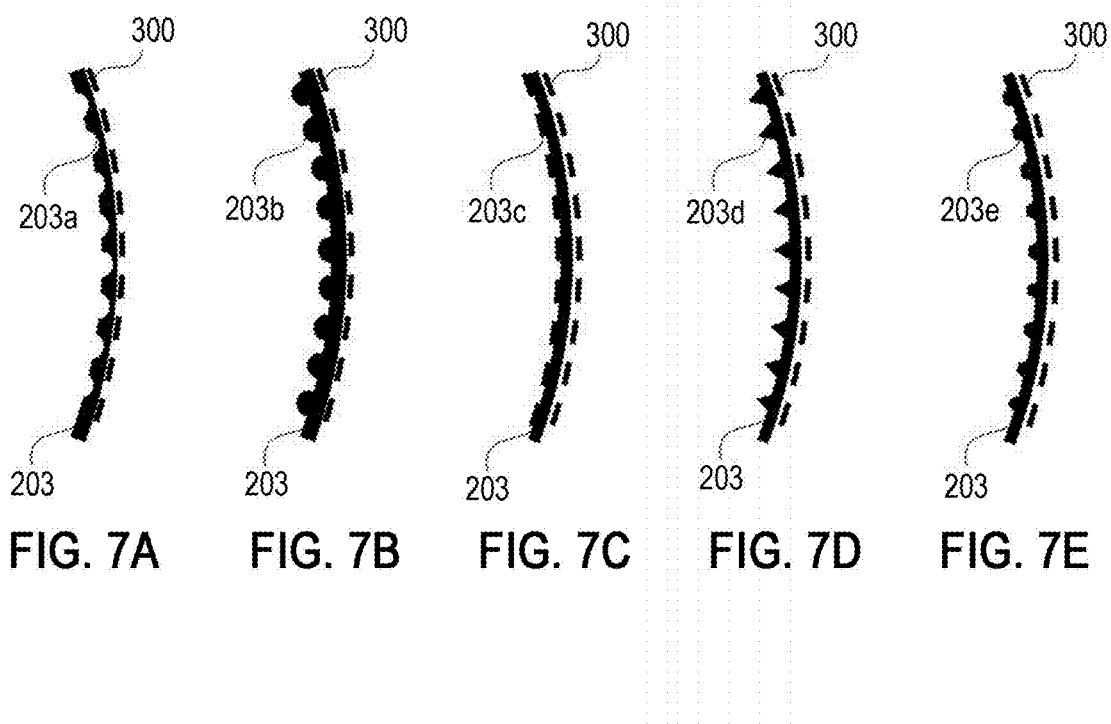

SEMICONDUCTOR DEVICE MANUFACTURING METHOD, SUBSTRATE PROCESSING APPARATUS AND RECORDING MEDIUM

CROSS-REFERENCE TO RELATED APPLICATION

This application is based upon and claims the benefit of priority from Japanese Patent Application No. 2016-055364, filed on Mar. 18, 2016, the entire contents of which are incorporated herein by reference.

TECHNICAL FIELD

The present disclosure relates to a semiconductor device manufacturing method, a substrate processing apparatus and a non-transitory computer-readable recording medium.

BACKGROUND

As one of many processes of manufacturing a semiconductor device, a process of loading a substrate into a process chamber of a substrate processing apparatus, supplying a precursor gas and a reaction gas into the process chamber, and forming various kinds of films such as an insulating film, a semiconductor film, a conductor film or the like on the substrate, or a process of removing these films from the substrate, is often carried out.

In mass production devices where fine patterns are formed, there is a desire to lower a temperature so as to suppress the diffusion of impurities or allow a material having low heat resistance, such as an organic material or the like, to be used.

To cope with this problem, a plasma-based substrate process is generally performed. However, active species such as ions, radicals or the like generated by plasma vary in terms of quantity and lifetime depending on a type, which makes it difficult to uniformly process a film.

SUMMARY

The present disclosure provides some embodiments of a technique for facilitating a uniform substrate process.

According to one embodiment of the present disclosure, there is provided a substrate processing apparatus including: a reaction tube with a process chamber defined therein, the process chamber being configured to process a substrate; a heating device installed outside the reaction tube and configured to heat the process chamber; a gas supply part installed inside the reaction tube and configured to supply a process gas used in processing the substrate; and a plasma generating part including an electrode composed of a first electrode portion connected to a high frequency power supply and a second electrode portion grounded to the earth, which are installed to surround the entire circumference of an outer wall of the reaction tube, wherein an inter-electrode distance between the first electrode portion and the second electrode portion which are adjacent to each other is determined by at least a frequency of the high frequency power supply and a voltage applied across the electrode, and the first electrode portion and the second electrode portion are installed based on the determined inter-electrode distance.

BRIEF DESCRIPTION OF THE DRAWINGS

FIGS. 7A to 7E are views showing five examples of a second modification of the embodiment of the present disclosure, respectively.

DETAILED DESCRIPTION

Embodiment of the Present Disclosure

An embodiment of the present disclosure will now be described with reference to FIGS. 1 to 5.

(1) Configuration of Substrate Processing Apparatus (Heating Device)

Figure 1:
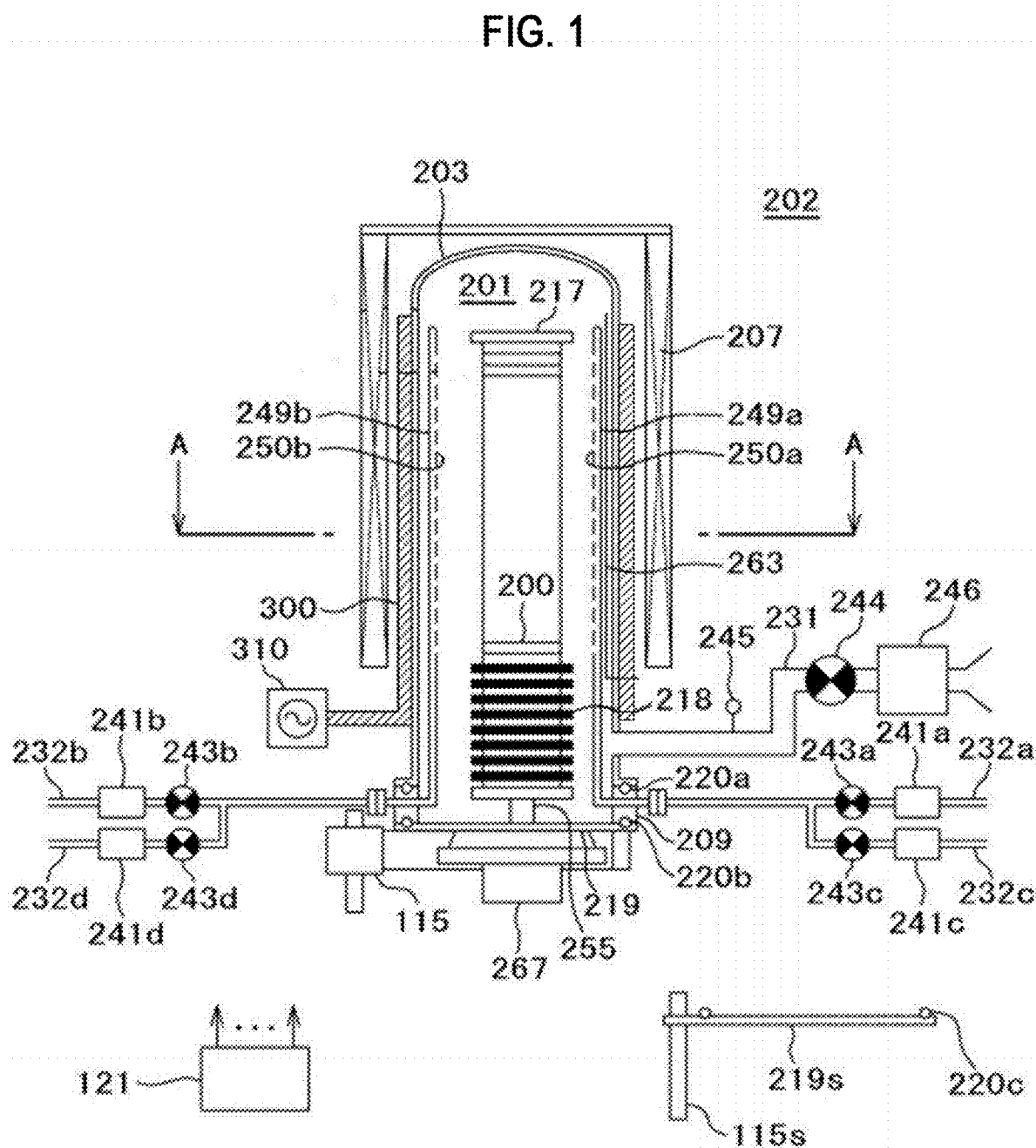
FIG. 1 is a schematic configuration view of a vertical processing furnace of a substrate processing apparatus suitably used in an embodiment of the present disclosure, in which a portion of the processing furnace is shown in a vertical cross section.

As shown in FIG. 1, a processing furnace 202 includes a heater 207 as a heating device (a heating mechanism). The heater 207 has a cylindrical shape and is supported by a heater base (not shown) serving as a support plate so as to be vertically installed. As will be described later, the heater 207 functions as an activation mechanism (an excitation part) configured to thermally activate (excite) a gas.

(Process Chamber)

An electrode 300 of a plasma generating part to be described later is disposed in the inner side of the heater 207. In addition, a reaction tube 203 is disposed inside the heater 207 in a concentric relationship with the heater 207. The reaction tube 203 is made of a heat resistant material such as quartz ($SiO_2$), silicon carbide (SiC), silicon nitride (SiN) or the like and is formed in a cylindrical shape with its upper end closed and its lower end opened. A manifold 209 is disposed in a concentric relationship with the reaction tube 203 under the reaction tube 203. The manifold 209 is made of, e.g., metal such as stainless steel (SUS) or the like and has a cylindrical shape with upper and lower ends opened. An upper end portion of the manifold 209 engages with a lower end portion of the reaction tube 203 so as to support the reaction tube 203. An O-ring 220a serving as a seal member is installed between the manifold 209 and the reaction tube 203. As the manifold 209 is supported by the heater base, the reaction tube 203 is vertically installed. A process vessel (reaction vessel) is mainly constituted by the combination of the reaction tube 203 and the manifold 209. A process chamber 201 is formed in a hollow cylindrical portion of the process vessel. The process chamber 201 is configured to accommodate a plurality of wafers 200 as substrates. Incidentally, the process vessel is not limited to the above-described configuration and only the reaction tube 203 may be sometimes referred to as a process vessel.

(Gas Supply Part)

Nozzles 249a and 249b are installed inside the process chamber 201 so as to penetrate through a sidewall of the manifold 209. Gas supply pipes 232a and 232b are respectively connected to the nozzles 249a and 249b. In this way, the two nozzles 249a and 249b and the two gas supply pipes 232a and 232b are installed in the process vessel such that plural kinds of gases are supplied into the process chamber 201. In a case where only the reaction tube 203 is used as the process vessel, the nozzles 249a and 249b may be installed so as to penetrate through a sidewall of the reaction tube 203.

Mass flow controllers (MFCs) 241a and 241b, which are flow rate controllers (flow rate control parts), and valves 243a and 243b, which are opening/closing valves, are installed in the gas supply pipes 232a and 232b in this order from respective upstream sides, respectively. Gas supply pipes 232c and 232d for supplying an inert gas are respectively connected to the gas supply pipes 232a and 232b at the downstream sides of the valves 243a and 243b. MFCs 241c and 241d and valves 243c and 243d are installed in the gas supply pipes 232c and 232d in this order from respective upstream sides, respectively.

Each of the nozzles 249a and 249b is disposed in an annular space (when viewed from top) between the inner wall of the reaction tube 203 and the wafers 200 so as to extend upward along a stack direction of the wafers 200 from a lower portion of the inner wall of the reaction tube 203 to an upper portion thereof. That is to say, the nozzles 249a and 249b are respectively installed in a perpendicular relationship with the surfaces (flat surfaces) of the wafers 200 at a lateral side of the end portions (peripheral portions) of the wafers 200, which are loaded into the process chamber 201. Gas supply holes 250a and 250b through which a gas is supplied are formed in the side surfaces of the nozzles 249a and 249b, respectively. Each of the gas supply holes 250a and 250b is opened toward the center of the reaction tube 203 to allow the gas to be supplied toward the wafers 200. The gas supply holes 250a and 250b may be formed at multiple locations between the lower portion of the reaction tube 203 and the upper portion thereof.

As described above, in this embodiment, a gas is transferred through the nozzles 249a and 249b, which are disposed in the vertically-elongated annular space (when viewed from top), i.e., a cylindrical space, defined by the inner surface of the side wall of the reaction tube 203 and the end portions (peripheral portion portions) of the plurality of wafers 200 arranged in the reaction tube 203. The gas is initially injected into the reaction tube 203, near the wafers 200, through the gas supply holes 250a and 250b formed respectively in the nozzles 249a and 249b. Accordingly, the gas supplied into the reaction tube 203 mainly flows in the reaction tube 203 in a direction parallel to the surfaces of the wafers 200, i.e., in a horizontal direction. With this configuration, the gas can be uniformly supplied to the respective wafers 200, thus improving the uniformity of thickness of a film formed on each of the wafers 200. The gas flowing on the surfaces of the wafers 200, i.e., the residual gas remaining after reaction, flows toward an exhaust port, i.e., an exhaust pipe 231 which will be described later. The flow direction of the residual gas is not limited to a vertical direction but may be appropriately varied depending on a position of the exhaust port.

A precursor containing a predetermined element, for example, a silane precursor gas which contains silicon (Si) as the predetermined element, is supplied from the gas supply pipe 232a into the process chamber 201 via the MFC 241a, the valve 243a and the nozzle 249a.

The silane precursor gas refers to a gaseous silane precursor, for example, a gas obtained by vaporizing a silane precursor which remains in a liquid state under room temperature and atmospheric pressure, or a silane precursor which remains in a gas state under room temperature and atmospheric pressure. When the term "precursor" is used herein, it may refer to "a liquid precursor staying in a liquid state," "a precursor gas staying in a gaseous state," or both.

An example of the silane precursor gas may include a precursor gas containing Si and an amino group (amine group), i.e., an aminosilane precursor gas. An aminosilane precursor is a silane precursor having an amino group. The aminosilane precursor is also a silane precursor having an alkyl group such as a methyl group, an ethyl group or a butyl group, and a precursor containing at least Si, nitrogen (N) and carbon (C). That is to say, the aminosilane precursor used herein may be referred to as an organic-based precursor or an organic aminosilane precursor.

An example of the aminosilane precursor gas may include a bis-tertiary-butylaminosilane ($SiH_2[NH(C_4H_9)]_2$, abbreviation: BTBAS) gas. BTBAS may be referred to as a precursor gas containing one Si in one molecule and having a Si—N bond, an N—C bond and no Si—C bond. The BTBAS gas acts as a Si source.

In the case of using a liquid precursor such as BTBAS which is in a liquid state under room temperature and atmospheric pressure, the liquid precursor is vaporized by a vaporization system such as a vaporizer or a bubbler and is supplied as a silane precursor gas (a BTBAS gas or the like).

A reactant differing in chemical structure from the precursor, for example, an oxygen (O)-containing gas, is supplied from the gas supply pipe 232b into the process chamber 201 via the MFC 241b, the valve 243b and the nozzle 249b.

The O-containing gas acts as an oxidizing agent (an oxidizing gas), i.e., an O source. An example of the O-containing gas may include an oxygen ($O_2$) gas, vapor ($H_2O$ gas) or the like. In the case of using the $O_2$ gas as the oxidizing agent, for example, this gas is plasma-excited using a plasma source (to be described later) and supplied as a plasma excitation gas ($O_2^*$ gas).

An inert gas, for example, a nitrogen ($N_2$) gas, is supplied from the gas supply pipes 232c and 232d into the process chamber 201 via the MFCs 241c and 241d, the valves 243c and 243d, the gas supply pipes 232a and 232b and the nozzles 249a and 249b, respectively.

A precursor supply system as a first gas supply system is mainly configured by the gas supply pipe 232a, the MFC 241a and the valve 243a. A reactant supply system as a second gas supply system is mainly configured by the gas supply pipe 232b, the MFC 241b and the valve 243b. An inert gas supply system is mainly configured by the gas supply pipes 232c and 232d, the MFCs 241c and 241d and the valves 243c and 243d. The precursor supply system, the reactant supply system and the inert gas supply system are simply referred to as a gas supply system (gas supply part).

(Substrate Support)

As illustrated in FIG. 1, a boat 217 serving as a substrate support is configured to support a plurality of, e.g., 25 to 200 wafers 200, in such a state that the wafers 200 are arranged in a horizontal posture and in multiple stages along a vertical direction with the centers of the wafers 200 aligned with one another. That is to say, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in multiple stages. With this configuration, it is hard for heat generated from the heater 207 to be radiated to a seal cap 219. However, this embodiment is not limited to such a configuration. For example, instead of installing the heat insulating plates 218 below the boat 207, a heat insulating tube as a tubular member made of a heat resistant material such as quartz or SiC may be installed.

(Plasma Generating Part)

Next, a plasma generating part will be described with reference to FIGS. 1 to 3.

Figure 2:
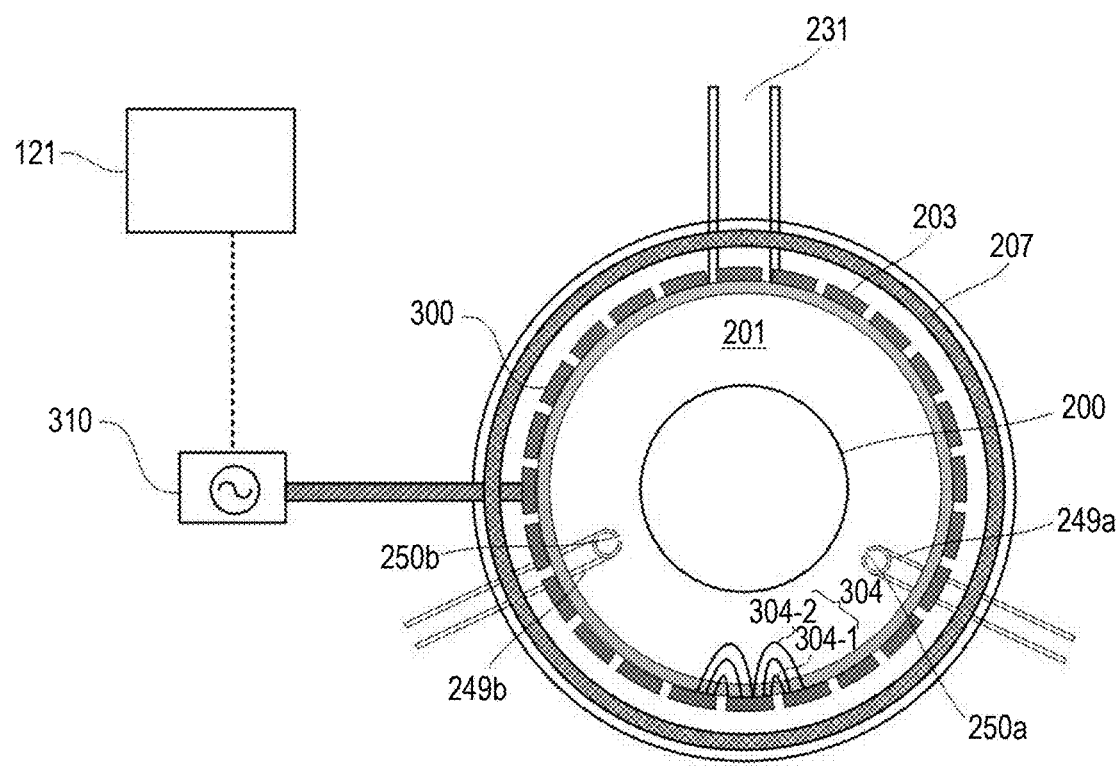
FIG. 2 is a partially-enlarged sectional view taken along line A-A in the substrate processing apparatus shown in FIG. 1.

As illustrated in FIG. 2, plasma is generated inside the reaction tube 203, which is a vacuum partition wall made of quartz or the like, at the time of supplying a reaction gas, by using a capacitively-coupled plasma (CCP).

As shown in FIG. 2, the electrode 300 is disposed between the reaction tube 203 and the heater 207 so as to surround the entire circumference of the reaction tube 203. A high frequency wave having a frequency of, e.g., 13.56 MHz is input to the electrode 300 from a high frequency power supply 310 via a matching device 303. The electrode 300 is mainly composed of a first electrode portion 301 connected to the high frequency power supply 310 and a second electrode portion 302 that is grounded to the earth. An electric field 304 is established between the first electrode portion 301 and the second electrode portion 302 which are adjacent to each other so that plasma is generated inside the reaction tube 203. Here, as shown in FIG. 2, the electric field 304 includes a minimum electric field 304-1 formed according to an inter-electrode distance D which will be described later, and a maximum electric field 304-2 formed according to an electrode pitch (a distance between the centers of the first electrode 301 and the second electrode 302) which will be described later. In other words, the minimum electric field 304-1 is formed due to an influence by the inter-electrode distance D and the maximum electric field 304-2 is formed due to an influence by the electrode pitch. As shown in FIG. 3, the first electrode portion 301 and the second electrode portion 302 are alternately extended in parallel to each other in the same direction as the extension direction of the gas nozzles 249a and 249b. By configuring and disposing the electrode 300 in this manner, it becomes possible to uniformly generate plasma over the entire area within the reaction tube 203 and supply active species for substrate process from the entire circumference of the wafers 200 by means of the uniformly-generated plasma. A plasma generating part is mainly constituted by the electrode 300 (the first electrode portion 301 and the second electrode portion 302), the matching device 303 and the high frequency power source 310.

Figure 3:
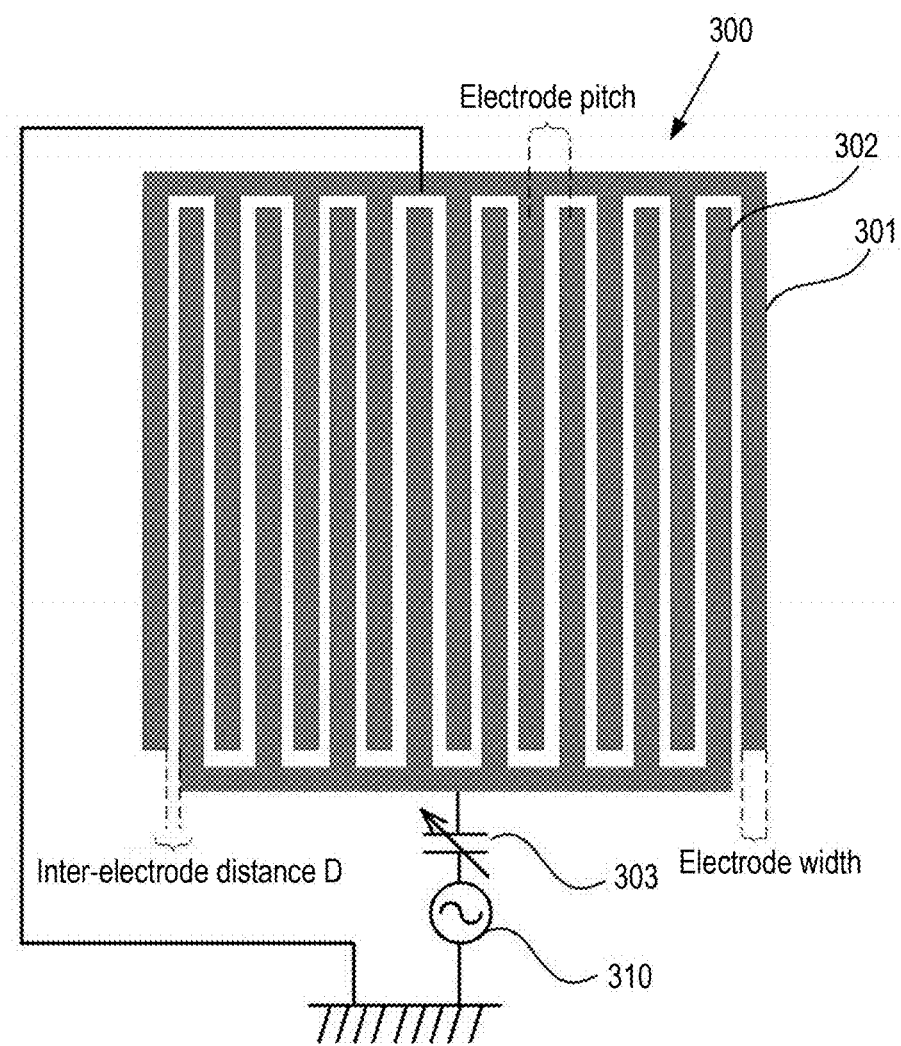
FIG. 3 is a view for explaining a configuration of a plasma generating part in the substrate processing apparatus shown in FIG. 1.

Here, as shown in FIG. 3, the inter-electrode distance D between the first electrode portion 301 and the second electrode portion 302 needs be set in such a manner that electrons applied by the high frequency power source 310 make a reciprocating motion without colliding with the first electrode portion 301 and the second electrode portion 302. Therefore, the inter-electrode distance D can be determined by the following equation (1) according to the energy conservation law and the simple harmonic motion formula. By setting the inter-electrode distance D at a value determined by the equation (1) or its surrounding values (values in a range of half to twice the determined value), it is possible to improve plasma generation efficiency. If the inter-electrode distance D is set to be smaller than half the determined value, electron disappearance on the electrode side becomes remarkable, which allows the plasma to be deactivated easily. In addition, if the inter-electrode distance D is set to be larger than twice the determined value, an electrical action on the electrons becomes remarkably weak, which results in low plasma generation efficiency.

$$D = \frac{\sqrt{eV/2m}}{\pi f} \qquad \text{Equation (1)}$$

In the above equation [1], V is an inter-electrode voltage, f is a frequency of the high frequency power supply, m is a mass of the electron, and e/m is a specific charge of electrons.

For example, when the frequency of the high frequency power supply is set to fall within a range of 2 to 60 MHz and the inter-electrode voltage is set to fall within a range of 25 to 1,000V, the inter-electrode D may be determined to fall within a range of about 0.5 to 94 mm.

The electrode 300 can be made of metal such as aluminum, copper, stainless steel or the like but may be made of an oxidation resistant material such as nickel so as to facilitate the substrate process while suppressing deterioration of the electric conductivity of the surface of the electrode. By suppressing the deterioration of the electric conductivity of the surface of the electrode, it is possible to suppress deterioration of the plasma generation efficiency.

In a vertical type substrate processing apparatus, plasma of a CCP mode was generated when the temperature of a reaction chamber was set to 500 degrees C., the pressure of the reaction chamber was set to 100 Pa, the frequency of a high frequency power supply was set to 13.56 MHz, and a plurality of high frequency electrodes each having a length of 1 m and an electrode width of 15 mm was arranged at an inter-electrode distance D of 10 mm such that polarities thereof alternate in the outer wall of a tubular reaction tube. In addition, a gap between the inner wall of the reaction tube and a wafer was set to 50 mm in a concentric circle.

Here, an internal pressure of a furnace at the time of the substrate process may be controlled to fall within a range of 10 to 300 Pa. The reason for this is as follows. If the internal pressure of the furnace is less than 10 Pa, the mean free path of gas molecules becomes longer than the Debye length of plasma, plasma directly striking a wall of the furnace becomes conspicuous. This makes it difficult to suppress generation of particles. In addition, if the internal pressure of the furnace is more than 300 Pa, the plasma generation efficiency is saturated. Therefore, even if a reaction gas is supplied, the amount of generation of plasma does not change, wastefully consuming the reaction gas.

In addition, in this embodiment, the electrode pitch may be set to be twice or more the thickness t of the reaction tube and not more than twice a distance between the peripheral portion of the wafer and the outer wall of the reaction tube. Specifically, the electrode may be formed with the electrode pitch set to fall with a range of 10 to 110 mm. The reason for this is as follows. If the electrode pitch is set to be smaller than twice the thickness t of the reaction tube as shown in FIG. 2, all of the electric fields 304 generated by applying a high frequency voltage between the electrodes become shorter than the thickness of the reaction tube in the radial direction of the reaction tube. That is to say, this is because no electric field 304 is formed inside the reaction tube and the generated plasma is prone to be creeping-discharged on the surface of the reaction tube, thereby decreasing the plasma generation efficiency. Further, if the electrode pitch is set to be greater than twice the distance between the peripheral portion of the wafer and the outer wall of the reaction tube, the electric field 304 becomes longer in the radial direction of the reaction tube and reaches the peripheral portion of the wafer, which makes it easier to generate plasma between the electrode and the peripheral portion of the wafer. Upon generating plasma between the electrode and the peripheral portion of the wafer, plasma damage occurs in the wafer, thereby deteriorating the quality of the film.

There is a need to set the frequency of the high frequency power supply to a frequency at which electrons reciprocating in plasma have a vibration amplitude capable of vibrating without colliding with the first electrode portion 301 and the second electrode portion 302. The minimum vibration frequency $f_0$ at which electrons can vibrate without colliding with the electrodes may be expressed by the following equation (2) according to the energy conservation law and the simple harmonic motion formula. The maximum value X of the vibration amplitude corresponds to half of an electric force line of the high frequency voltage V connecting the centers of the electrodes, and e/m is a specific charge of electrons as in the equation (1). If the frequency of the high frequency power supply is equal to or more than the minimum vibration frequency $f_0$, electrons can be secured so that they are not lost at the electrode side, which improves the plasma generation efficiency.

$$f_0 = \frac{\sqrt{eV/2m}}{\pi x} \qquad \text{Equation (2)}$$

The electric field generated by the inter-electrode voltage may be weakened by the effect of a dielectric, plasma shielding, or the like. As such, a voltage in the inner side of the dielectric and plasma shielding may be lowered. Therefore, in consideration of relative permittivity εr of the reaction tube and Debye shielding of plasma, the equations (1) and (2) are required to be corrected with respect to the inter-electrode voltage V.

$$V \to \frac{\varepsilon_r X}{(t + \varepsilon_r X)\exp(1)} V \qquad \text{Equation (3)}$$

In the above equation (3), t is the thickness of the reaction tube and exp(1) is the Napier number (the base of natural logarithm). In this embodiment to be described later, the minimum vibration frequency $f_0$ is 4.5 MHz when the maximum voltage V is equal to 1,000V. For example, since the above-described high frequency power supply frequency of 13.56 MHz is more than the minimum vibration frequency $f_0$, plasma can be generated with high efficiency.

By determining the inter-electrode distance D according to the equations (1), (2) and (3) in this way, it is possible to improve the plasma generation efficiency and improve a wafer process speed while improving the uniformity of wafer process.

(Exhaust Part)

As shown in FIG. 1, the exhaust pipe 231 for exhausting an internal atmosphere of the process chamber 201 is installed in the reaction tube 203. A vacuum pump 246 used as a vacuum exhaust device is connected to the exhaust pipe 231 via a pressure sensor 245, which is a pressure detector (pressure detecting part) for detecting an internal pressure of the process chamber 201, and an auto pressure controller (APC) valve 244, which is an exhaust valve (pressure regulating part). The APC valve 244 is a valve configured to evacuate the interior of the process chamber 201 or stop such an evacuation operation by opening or closing the valve while the vacuum pump 246 is actuated. Further, the APC valve 244 is a valve configured to regulate the internal pressure of the process chamber 201 by adjusting an opening degree of the valve based on pressure information detected by the pressure sensor 245 while the vacuum pump 246 is actuated. An exhaust system is mainly configured by the exhaust pipe 231, the APC valve 244 and the pressure sensor 245. The vacuum pump 246 may be regarded as being included in the exhaust system. The exhaust pipe 231 is not limited to being installed in the reaction tube 203 but may be installed in the manifold 209 in the same manner as the nozzles 249a and 249b.

(Peripheral Devices)

The seal cap 219, which serves as a furnace opening cover configured to air-tightly seal a lower end opening of the reaction tube 203, is installed under the manifold 209. The seal cap 219 is configured to make contact with the lower end of the manifold 209 at a lower side in the vertical direction. The seal cap 219 is made of metal such as, e.g., stainless steel (SUS) or the like, and is formed in a disc shape. An O-ring 220b, which is a seal member making contact with the lower end of the manifold 209, is installed on an upper surface of the seal cap 219.

A rotation mechanism 267 configured to rotate the boat 217 is installed at the opposite side of the seal cap 219 from the process chamber 201. A rotary shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 115 is configured to load and unload the boat 217 into and from the process chamber 201 by moving the seal cap 219 up and down.

The boat elevator 115 is configured as a transfer device (transfer mechanism) which transfers the boat 217, i.e., the wafers 200, into and out of the process chamber 201. In addition, a shutter 219s, which serves as a furnace opening cover configured to air-tightly seal the lower end opening of the manifold 209 while the seal cap 219 is descended by the boat elevator 115, is installed under the manifold 209. The shutter 219s is made of metal such as, e.g., stainless steel (SUS) or the like, and is formed in a disc shape. An O-ring 220c, which is a seal member making contact with the lower end of the manifold 209, is installed on an upper surface of the shutter 219s. The opening/closing operation (such as elevation operation, rotation operation or the like) of the shutter 219s is controlled by a shutter opening/closing mechanism 115s.

A temperature sensor 263 serving as a temperature detector is installed inside the reaction tube 203. Based on temperature information detected by the temperature sensor 263, a state of supplying electric power to the heater 207 is adjusted such that the interior of the process chamber 201 has a desired temperature distribution. Similar to the nozzles 249a and 249b, the temperature sensor 263 is installed along the inner wall of the reaction tube 203.

(Control Device)

Figure 4:
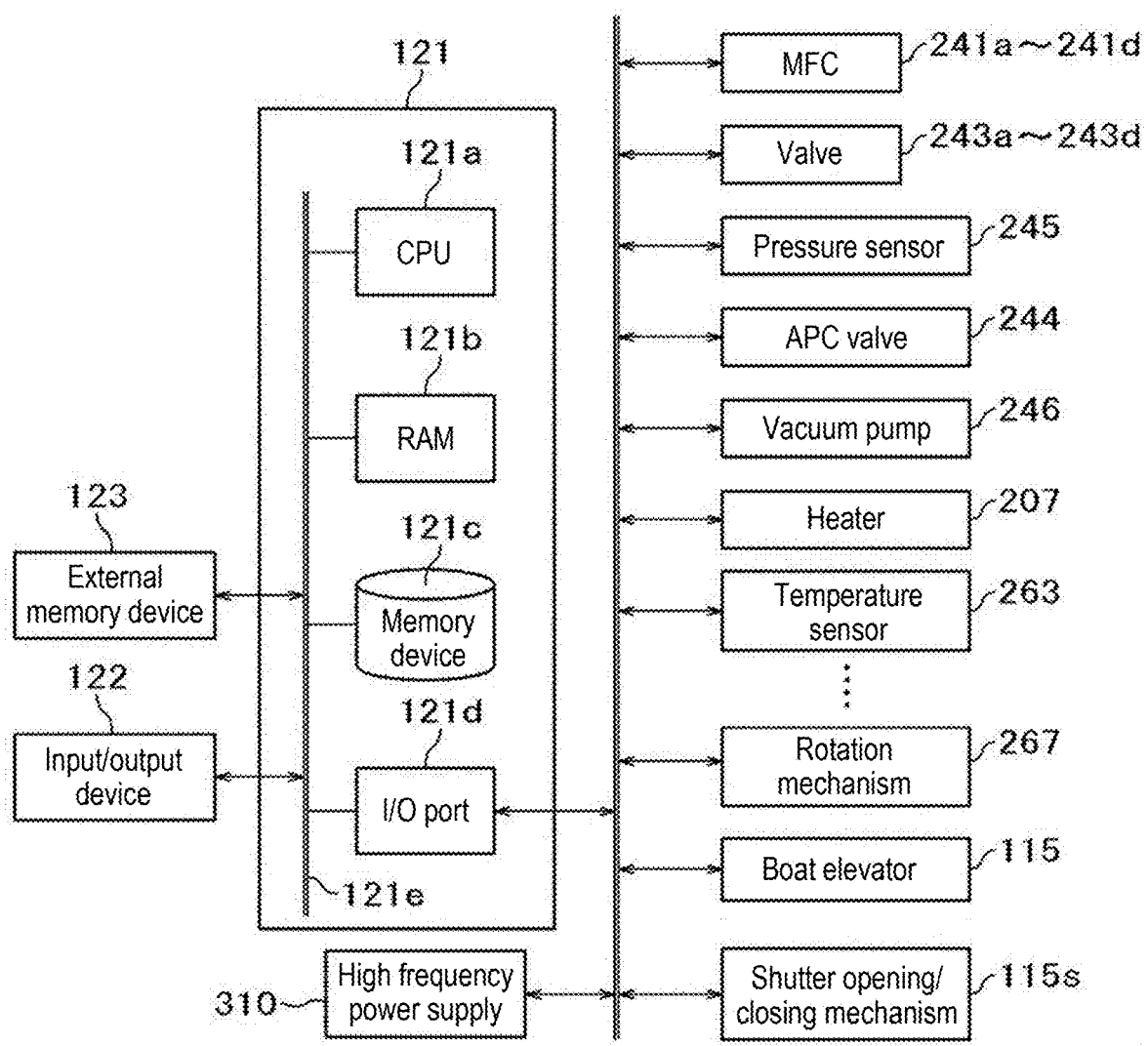
FIG. 4 is a schematic configuration view of a controller of the substrate processing apparatus shown in FIG. 1, in which one example of a control system of the controller is shown in a block diagram.

Next, a control device will be described with reference to FIG. 4. FIG. 4 is a block diagram showing one example of a controller of the substrate processing apparatus shown in FIG. 1. As illustrated in FIG. 4, a controller 121, which is a control part (control device), may be configured as a computer including a central processing unit (CPU) 121a, a random access memory (RAM) 121b, a memory device 121c and an I/O port 121d. The RAM 121b, the memory device 121c and the I/O port 121d are configured to exchange data with the CPU 121a via an internal bus 121e. An input/output device 122 constituted by, e.g., a touch panel or the like, is connected to the controller 121.

The memory device 121c is configured with, e.g., a flash memory, a hard disc drive (HDD) or the like. A control program for controlling operations of a substrate processing apparatus and a process recipe in which sequences and conditions of a film forming process to be described later are written, are readably stored in the memory device 121c. The process recipe function as a program for causing the controller 121 to execute each sequence in the film forming process (to be described later) to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the heater 207, the temperature sensor 263, the rotation mechanism 267, the boat elevator 115, the shutter opening/closing mechanism 115s, the high frequency power supply 310 and the like.

The CPU 121a is configured to read and execute the control program from the memory device 121c. The CPU 121a is also configured to read the recipe from the memory device 121c according to an input of an operation command from the input/output device 122. In addition, the CPU 121a is configured to control the rotational operation of the rotation mechanism 267, the flow rate adjusting operation of various kinds of gases by the MFCs 241a to 241d, the opening/closing operation of the valves 243a to 243d, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of forward/backward rotation and adjustment operation of rotation angle and rotation speed of the boat 217 with the rotation mechanism 267, the operation of moving the boat 217 up and down with the boat elevator 115, the opening/closing operation of the shutter 219s with the shutter opening/closing mechanism 115s, the operation of supply of power of the high frequency power supply 310, and the like, according to contents of the read recipe.

The controller 121 may be configured by installing, on the computer, the aforementioned program stored in an external memory device 123 (for example, a magnetic disc such as a hard disc, an optical disc such as a CD, a magneto-optical disc such as an MO, a semiconductor memory such as a USB memory, etc.). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using communication means such as the Internet or a dedicated line, instead of using the external memory device 123.

(2) Substrate Processing Process

Figure 5:
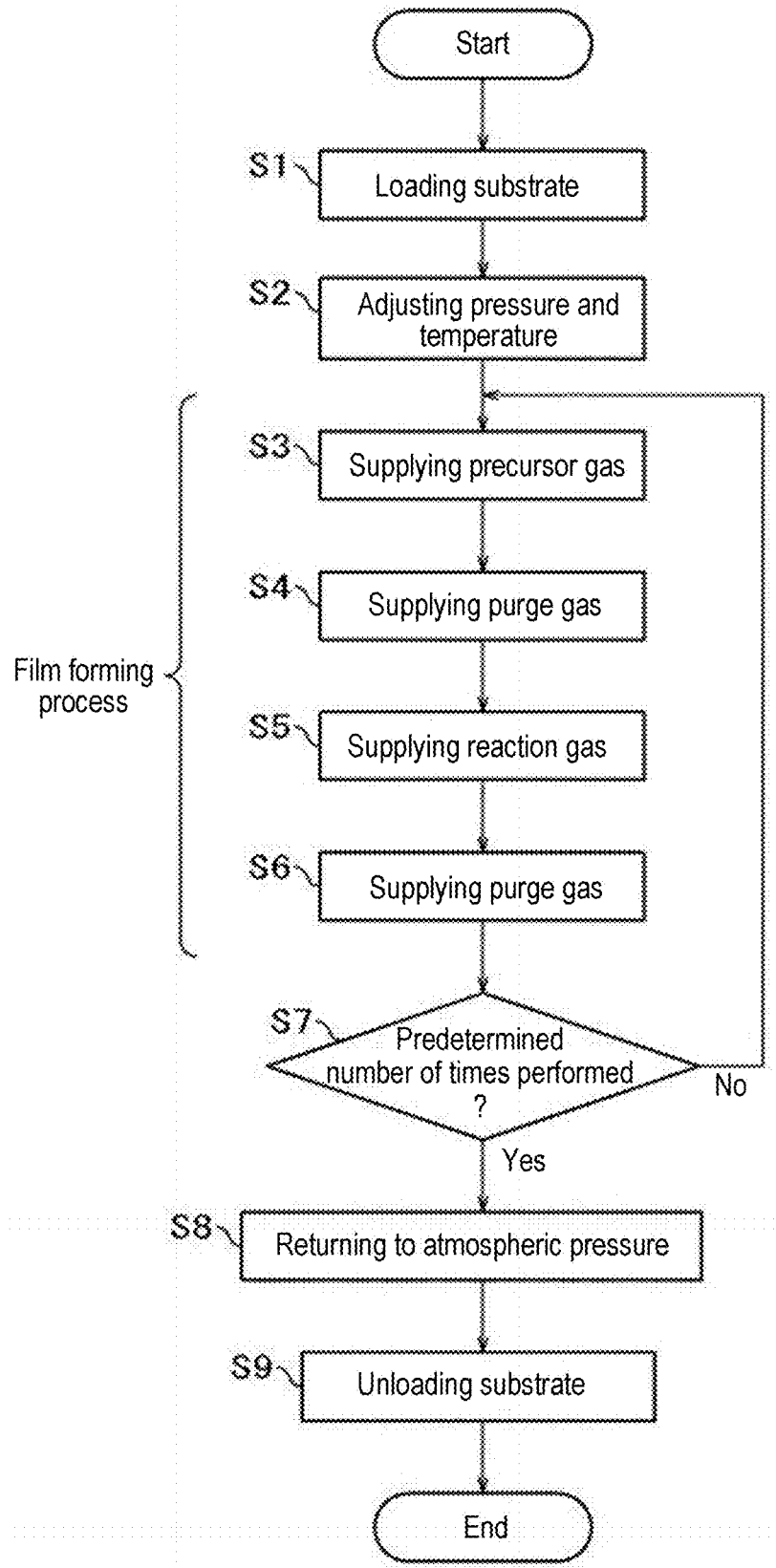
FIG. 5 is a flowchart showing one example of a substrate processing process using the substrate processing apparatus shown in FIG. 1.

A process example of forming a film on a substrate using the aforementioned substrate processing apparatus, which is one of many processes for manufacturing a semiconductor device, will be described below with reference to FIG. 5. In the following descriptions, the operations of the respective parts constituting the substrate processing apparatus are controlled by the controller 121.

In the present disclosure, for the sake of convenience, a film forming sequence illustrated in FIG. 5 may sometimes be denoted as follows. The same denotation will be used in modifications and other embodiments to be described later.

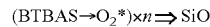

$(BTBAS \rightarrow O_2^*) \times n \Rightarrow SiO$

When the term "wafer" is used in the present disclosure, it may refer to "a wafer itself" or "a wafer and a laminated body (aggregate) of predetermined layers or films formed on a surface of the wafer." That is to say, a wafer including predetermined layers or films formed on its surface may be referred to as a wafer. In addition, when the phrase "a surface of a wafer" is used in the present disclosure, it may refer to "a surface (exposed surface) of a wafer itself" or "a surface of a predetermined layer or film formed on a wafer, namely, an uppermost surface of the wafer, which is a laminated body."

Accordingly, in the present disclosure, the expression "a predetermined gas is supplied to a wafer" may mean that "a predetermined gas is directly supplied to a surface (exposed surface) of a wafer itself" or that "a predetermined gas is supplied to a layer or film formed on a wafer, namely, to an uppermost surface of a wafer as a laminated body." Furthermore, in the present disclosure, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely, to an uppermost surface of a wafer as a laminated body."

In addition, when the term "substrate" is used in the present disclosure, it may be synonymous with the term "wafer."

(Loading Step: S1)

Upon a plurality of wafers 200 is charged in the boat 217 (wafer charging), the shutter 219s is moved by the shutter opening/closing mechanism 115s so that the lower end opening of the manifold 209 is opened (shutter opening). Thereafter, as illustrated in FIG. 1, the boat 217 supporting the plurality of wafers 200 is lifted up by the boat elevator 115 to be loaded into the process chamber 201 (boat loading). In this state, the seal cap 219 seals the lower end of the manifold 209 through the O-ring 220b.

(Pressure and Temperature Adjusting Step: S2)

The interior of the process chamber 201, namely the space in which the wafers 200 exist, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. The vacuum pump 246 is continuously activated at least until a film forming step to be described later is completed.

The wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution. The heating of the interior of the process chamber 201 by the heater 207 is continuously performed at least until the film forming step to be described later is completed. However, when the film forming step is performed under a temperature condition of room temperature or lower, the heating of the interior of the process chamber 201 by the heater 207 may be omitted. When a process is merely performed under such a temperature condition, the heater 207 is unnecessary and the heater 207 may not be installed in the substrate processing apparatus. In this case, the configuration of the substrate processing apparatus can be simplified.

Subsequently, the rotation of the boat 217 and the wafers 200 by the rotation mechanism 267 begins. The rotation of the boat 217 and the wafers 200 by the rotation mechanism 267 is continuously performed at least until the film forming step to be described later is completed.

(Film Forming Steps: S3, S4, S5 and S6)

Thereafter, steps S3, S4, S5 and S6 are sequentially performed to form a film.

(Precursor Gas Supplying Step: S3 and S4)

In Step S3, a BTBAS gas is supplied to the wafers 200 in the process chamber 201.

The valve 243a is opened to allow the BTBAS gas to flow through the gas supply pipe 232a. The BTBAS gas, a flow rate of which is adjusted by the MFC 241a, is supplied from the gas supply holes 250a into the process chamber 201 via the nozzle 249a and subsequently, is exhausted through the exhaust pipe 231. At this time, the BTBAS gas is supplied to the wafers 200. At the same time, the valve 243c is opened to allow a $N_2$ gas to flow through the gas supply pipe 232c. The $N_2$ gas, a flow rate of which is adjusted by the MFC 241c, is supplied into the process chamber 201 together with the BTBAS gas and subsequently, is exhausted through the exhaust pipe 231.

In addition, in order to prevent the BTBAS gas from infiltrating into the nozzle 249b, the valves 243d is opened to allow the $N_2$ gas to flow through the gas supply pipe 232d. The $N_2$ gas is supplied into the process chamber 201 through the gas supply pipe 232b and the nozzle 249b and subsequently, is exhausted through the exhaust pipe 231.

The supply flow rate of the BTBAS gas, which is controlled by the MFC 241a, is set to fall within a range of, e.g., 1 to 2,000 sccm, specifically, 10 to 1,000 sccm. The supply flow rates of the $N_2$ gas, which are respectively controlled by the MFCs 241c and 241d, are set to fall within a range of, e.g., 100 to 10,000 sccm. The internal pressure of the process chamber 201 is set to fall within a range of, e.g., 1 to 2,666 Pa, specifically 67 to 1,333 Pa, as described above. A time period during which the BTBAS gas is supplied to the wafers 200 is set to fall within a range of, e.g., 1 to 100 seconds, specifically, 1 to 50 seconds.

The temperature of the heater 207 is set such that the temperature of the wafers 200 falls within a range of, e.g., 0 to 150 degrees C., specifically room temperature (25 degrees C.) to 100 degrees C., more specifically 40 to 90 degrees C. The BTBAS gas is a high-reaction gas which is easily adsorbed onto the wafers 200 or the like. Therefore, even when the temperature is as low as, for example, room temperature, the BTBAS gas can be chemisorbed onto the wafers 200, which makes it possible to obtain a practical deposition rate. By setting the temperature of the wafers 200 to 150 degrees C. or lower, further 100 degrees C. or lower, ultimately 90 degrees C. or lower as in the present embodiment, the amount of heat applied to the wafers 200 can be reduced and the thermal history undertaken by the wafers 200 can be satisfactorily controlled. In addition, at a temperature of 0 degrees C. or higher, the BTBAS gas can be sufficiently adsorbed onto the wafers 200, which makes it possible to obtain a sufficient deposition rate. Therefore, the temperature of the wafers 200 may be set to fall within the range of 0 to 150 degrees C., specifically room temperature to 100 degrees C., more specifically 40 to 90 degrees C.

By supplying the BTBAS gas to the wafers 200 under the aforementioned conditions, a Si-containing layer having a thickness of from less than one atomic layer (one molecular layer) to several atomic layers (several molecular layers) is formed on each of the wafers 200 (underlying films of the surfaces thereof). The Si-containing layer may be a Si layer, an adsorption layer of BTBAS, or both.

The Si layer is a generic name that encompasses a continuous or discontinuous layer composed of Si and a Si thin film formed of the layers overlapping with one another. The Si which constitutes the Si layer includes not only Si whose bond to an amino group is not completely broken but also Si whose bond to H is completely broken.

The adsorption layer of BTBAS includes not only a continuous adsorption layer composed of BTBAS molecules but also a discontinuous adsorption layer. The BTBAS molecules that constitute the adsorption layer of BTBAS include molecules whose bond to Si and an amino group is partially broken, whose bond to Si and H is partially broken, or whose bond to N and C is partially broken. That is to say, the adsorption layer of BTBAS may be a physical adsorption layer of BTBAS, a chemisorption layer of BTBAS, or both.

In this regard, the layer having a thickness of less than one atomic layer (one molecular layer) may mean an atomic layer (a molecular layer) that is discontinuously formed. The layer having a thickness of one atomic layer (one molecular layer) may mean an atomic layer (a molecular layer) that is continuously formed. The Si-containing layer may include both a Si layer and an adsorption layer of BTBAS. However, as described above, expressions such as "one atomic layer", "several atomic layers" and the like will be used with respect to the Si-containing layer, and the term "atomic layer" may be synonymous with the term "molecular layer."

Under a condition in which the BTBAS gas is autolyzed (or pyrolyzed), i.e., a condition in which a pyrolysis reaction of the BTBAS gas is generated, Si is deposited on the wafer 200 to form a Si layer. Under a condition in which the BTBAS gas is not autolyzed (or pyrolyzed), i.e., a condition in which a pyrolysis reaction of the BTBAS gas is not generated, BTBAS is adsorbed onto the wafer 200 to form an adsorption layer of BTBAS. However, in the present embodiment, since the temperature of the wafer 200 is set to a low temperature of, for example, 150 degrees C. or less, the pyrolysis of BTBAS hardly occurs. As a result, the adsorption layer of BTBAS rather than the Si layer is more likely to be formed on the wafer 200.

If the thickness of the Si-containing layer formed on the wafer 200 exceeds several atomic layers, a modification action in a modifying step (to be described later) does not reach the entire Si-containing layer. In addition, a possible minimum value of the thickness of the Si-containing layer formed on the wafer 200 is less than one atomic layer.

Accordingly, the thickness of the Si-containing layer may be set to fall within a range of less than one atomic layer to several atomic layers. By setting the thickness of the Si-containing layer to one atomic layer or less, namely one atomic layer or less than one atomic layer, it is possible to relatively increase the modification action in the modifying step which will be described later and to shorten the time required for a modifying reaction in the modifying step. It is also possible to shorten the time required for formation of the Si-containing layer in the film forming step. As a result, it is possible to shorten the process time per one cycle and hence shorten the total process time. That is to say, it is possible to increase the deposition rate. Furthermore, by setting the thickness of the Si-containing layer to one atomic layer or less, it is possible to enhance the controllability of the film thickness uniformity.

After the Si-containing layer is formed, the valve 243a is closed to stop the supply of the BTBAS gas into the process chamber 201. At this time, the interior of the process chamber 201 is vacuum-exhausted by the vacuum pump 246 with the APC valve 244 left opened. Thus, the unreacted BTBAS gas remaining in the process chamber 201, or the BTBAS gas which remains after contributing to the formation of the Si-containing layer, byproducts or the like, are discharged from the interior of the process chamber 201. In addition, with the valves 243c and 243d left opened, the supply of the $N_2$ gas into the process chamber 201 is maintained. The $N_2$ gas acts as a purge gas. This step S4 may be omitted and a precursor gas supplying step may be used instead.

As the precursor gas, in addition to the BTBAS gas, it may be possible to suitably use a tetrakisdimethylaminosilane ($Si[N(CH_3)_2]_4$, abbreviation: 4DMAS) gas, a trisdimethylaminosilane ($Si[N(CH_3)_2]_3H$, abbreviation: 3DMAS) gas, a bisdimethylaminosilane ($Si[N(CH_3)_2]_2H_2$, abbreviation: BDMAS) gas, a bisdiethylaminosilane ($Si[N(C_2H_5)_2]_2H_2$, abbreviation: BDEAS) gas or the like. Besides, as the precursor gas, it may be possible to suitably use various kinds of anminosilane precursor gases such as a dimethylaminosilane (DMAS) gas, a diethylaminosilane (DEAS) gas, a dipropylaminosilane (DPAS) gas, a diisopropylaminosilane (DIPAS) gas, a butylaminosilane (BAS) gas, a hexamethyldisilazane (HMDS) gas and the like; an inorganic halosilane precursor gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane, i.e., silicon tetrachloride ($SiCl_4$, abbreviation: STC) gas, a hexachlorodisilane ($Si_2Cl_6$, abbreviation: HCDS) gas, an octachlorotrisilane ($Si_3Cl_8$, abbreviation: OCTS) gas or the like; and an inorganic silane precursor gas containing no halogen group such as a monosilane ($SiH_4$, abbreviation: MS) gas, a disilane ($Si_2H_6$, abbreviation: DS) gas, a trisilane ($Si_3H_8$, abbreviation: TS) gas or the like.

As the inert gas, in addition to the $N_2$ gas, a rare gas such as an Ar gas, He gas, Ne gas, Xe gas or the like may be used.

(Reaction Gas Supplying Step: S5 and S6)

After the film forming process is completed, a plasma-excited $O_2$ gas as a reaction gas is supplied to the wafers 200 in the process chamber 201 (S5).

In this step, the opening/closing control of the valves 243b to 243d is performed in the same procedure as the opening/closing control of the valves 243a, 243c and 243d in the step S3. The $O_2$ gas, a flow rate of which is adjusted by the MFC 241b, is supplied into the process chamber 201 from the gas supply holes 250b via the nozzle 249b. At this time, high frequency power (having a frequency of 13.56 MHz, in the present embodiment) is supplied (applied) from the high frequency power supply 310 to the electrode 300. The $O_2$ gas supplied into the process chamber 201 is excited into a plasma state inside the process chamber 201, and is supplied. Gas thus plasma-excited is supplied as active species ($O_2$*) with respect to the wafers 200 via the gas supply holes 250c, and subsequently, is exhausted through the exhaust pipe 231. The plasma-excited $O_2$ gas is also referred to as oxygen plasma.

The supply flow rate of the $O_2$ gas controlled by the MFC 241b is set to fall within a range of, for example, 100 to 10,000 sccm. The high frequency power applied from the high frequency power supply 310 to the electrode 300 is set to fall within a range of, e.g., 50 to 1,000 W. The internal pressure of the process chamber 201 is set to fall within a range of, e.g., 10 to 300 Pa. By using plasma, it is possible to activate the $O_2$ gas even if the internal pressure of the process chamber 201 is set at such a relatively low pressure band. A time period during which the active species obtained by plasma-exciting the $O_2$ gas are supplied to the wafer 200 is set to fall within a range of, e.g., 1 to 100 seconds, specifically 1 to 50 seconds. Other process conditions are the same as those in the aforementioned step S3.

Ions generated in the oxygen plasma and the electrically-neutral active species are used in performing an oxidation process (to be described later) on the Si-containing layer formed on the surface of the wafer 200.

By supplying the $O_2$ gas to the wafer 200 under the aforementioned conditions, the Si-containing layer formed on the wafer 200 is plasma-oxidized. At this time, Si—N bonds and Si—H bonds contained in the Si-containing layer are cleaved by the energy of the plasma-excited $O_2$ gas. N and H separated from bonds with Si, and C bonding to N, are separated from the Si-containing layer. Then, Si in the Si-containing layer, which has a dangling bond as N or the like is separated, combines with O contained in the $O_2$ gas to form a Si—O bond. As this reaction proceeds, the Si-containing layer is changed (modified) into a layer containing Si and O, namely a silicon oxide layer (SiO layer).

To modify the Si-containing layer into the SiO layer requires plasma-exciting the $O_2$ gas to be supplied. The reason for this is as follows. Even if the $O_2$ gas is supplied under a non-plasma atmosphere, the energy necessary to oxidize the Si-containing layer is insufficient in the aforementioned temperature band. As such, it is difficult to sufficiently separate N or C from the Si-containing layer. Further, it is difficult to sufficiently oxidize the Si-containing layer, which fails to increase the Si—O bond.

After the Si-containing layer is changed into the SiO layer, the valve 243b is closed to stop the supply of the $O_2$ gas. In addition, the supply of the high frequency power to the electrode 300 is stopped. Then, according to the same process procedure and process conditions as in the step S4, the $O_2$ gas or the byproducts, which remains in the process chamber 201, is eliminated from the interior of the process chamber 201 (step S6). Alternatively, this step S6 may be omitted and the reaction gas supplying step may be used instead.

As the oxidizing agent, i.e., the O-containing gas to be plasma-excited, in addition to the $O_2$ gas, a nitrous oxide ($N_2O$) gas, a nitric oxide (NO) gas, a nitrogen dioxide ($NO_2$) gas, an ozone ($O_3$) gas, a hydrogen peroxide ($H_2O_2$) gas, vapor ($H_2O$ gas), a carbon monoxide (CO) gas, a carbon dioxide ($CO_2$) gas or the like may be used.

As the inert gas, in addition to the $N_2$ gas, various rare gases exemplified in the step S4 may be used.

(Performing Cycle a Predetermined Number of Times: S7)

By performing one cycle in which the aforementioned steps S3, S4, S5 and S6 are performed in this order in a non-simultaneous or asynchronous manner a predetermined number of times (n times), i.e., once or more, it is possible to form a SiO film having a predetermined composition and a predetermined film thickness on the wafer 200. The above cycle may be repeated a plurality of times. That is to say, the thickness of the SiO layer formed per cycle may be made smaller than a desired film thickness, and the above cycle may be repeated the plurality of times until the film thickness of the SiO film formed by laminating SiO layers reaches the desired film thickness.

(Atmospheric Pressure Returning Step: S8)

After the aforementioned film forming process is completed, the $N_2$ gas as the inert gas is supplied into the process chamber 201 from each of the gas supply pipes 232c and 232d and subsequently, is exhausted through the exhaust pipe 231. Thus, the interior of the process chamber 201 is purged with the inert gas and therefore the residual $O_2$ gas and the like remaining in the process chamber 201 are removed from the interior of the process chamber 201 (inert gas-based purging). Thereafter, the internal atmosphere of the process chamber 201 is substituted with the inert gas (inert gas substituting), and the internal pressure of the process chamber 201 is returned to the atmospheric pressure (atmospheric pressure returning: S8).

(Unloading Step: S9)

Thereafter, the seal cap 219 is moved down by the boat elevator 115 so that the lower end of the manifold 209 is opened, and the processed wafers 200 supported by the boat 217 are unloaded from the lower end of the manifold 209 outside of the reaction tube 203 (boat unloading). After the boat unloading, the shutter 219s is moved and the lower end opening of the manifold 209 is sealed by the shutter 219s via the O-ring 220c (shutter closing). The processed wafers 200 are unloaded from the reaction tube 203 and are discharged from the boat 217 (wafer discharging). Subsequently, after the wafer discharging, the empty boat 217 may be loaded into the process chamber 201.

(3) Effects According to the Present Embodiment

According to the present embodiment, one or more effects set forth below may be achieved.

(a) By placing an electrode over the entire circumference of a reaction tube, it is possible to uniformly supply active species from the entire circumference of a wafer. It is therefore possible to increase an amount of the active species reaching the wafer, thus improving a process speed of a wafer process while improving the uniformity of the wafer process.

(b) By setting an inter-electrode distance at a constant value determined by a predetermined equation, it is possible to improve plasma generation efficiency. In addition, since the plasma generation efficiency is improved, it is possible to improve the process speed of the wafer process while improving the uniformity of the wafer process.

(c) there is no need to change an internal structure of the reaction tube by disposing the electrode outside a process chamber. This suppresses the generation of particles and contamination caused by metal in the process chamber.

(d) By making the electrode of an oxidation resistant material, it is possible to reduce oxidation in a surface of the electrode, thus suppressing degradation of electric conductivity.

(4) Modifications

The substrate processing process in the present embodiment is not limited to the aforementioned aspects but may be changed as in the following modifications.

First Modification

Figure 6:
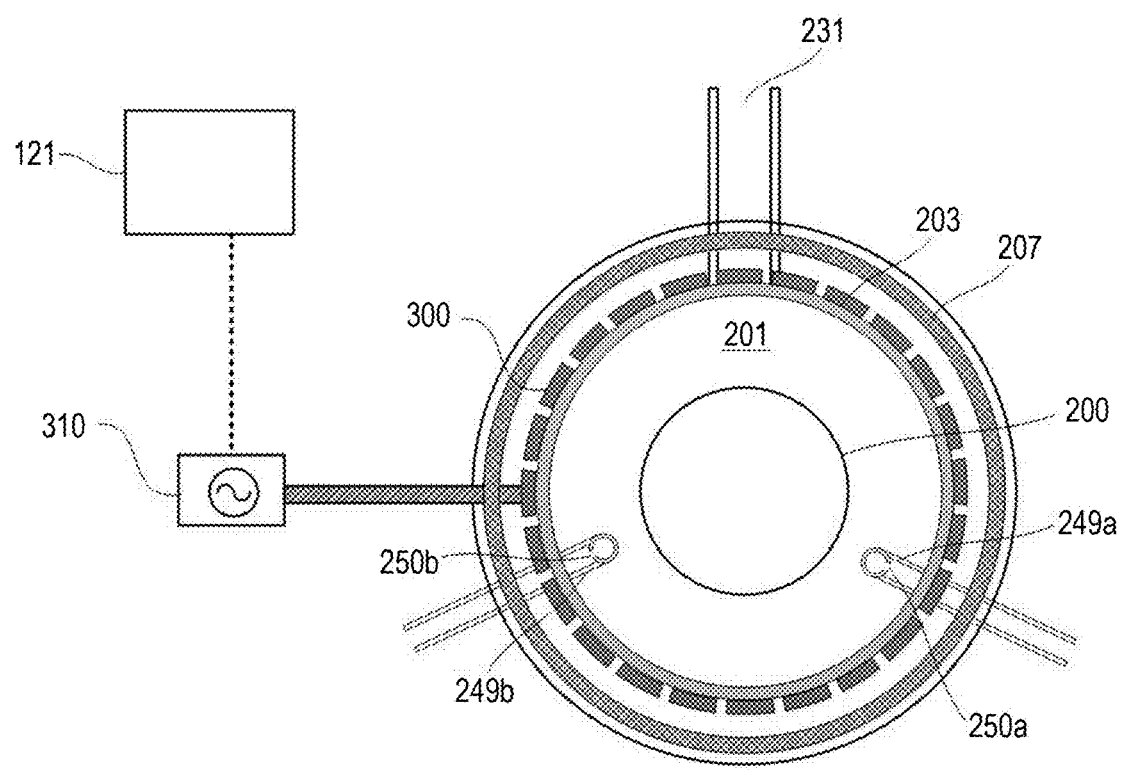
FIG. 6 is a view showing a first modification of the embodiment of the present disclosure.

As illustrated in FIG. 6, in a first modification of the present embodiment, the gas supply holes 250a and 250b are respectively formed so as to face the inner wall of the reaction tube 203, namely to face the electrode 300 rather than the wafer 200, such that a gas is supplied to a side opposite to the wafers 200. In addition, a supply flow rate of the gas and an exhaust amount of the gas are controlled such that the main flow of the gas inside the reaction tube 203 is oriented in a direction parallel to the surfaces of the wafers 200, i.e., a horizontal direction. With this configuration, it is possible to supply a reaction gas toward the electric field 304, thus efficiently generating plasma and easily generating active species in the wafers 200.

Second Modification

Further, as illustrated in FIGS. 7A to 7E, in a second modification of the present embodiment, irregularities are formed in the inner wall of the reaction tube 203 such that the surface area of the inner wall of the reaction tube 203 is increased. With this configuration, it is possible to reduce the density of active species having high kinetic energy, thus increasing the supply amount of active species having low kinetic energy inside the reaction tube 203. For example, as illustrated in FIG. 7A, hemispherical concave portions 203a are formed in the inner wall of the reaction tube 203. As illustrated in FIG. 7B, hemispherical convex portions 203b are formed in the inner wall of the reaction tube 203. As illustrated in FIG. 7C, rectangular convex portions 203c are formed in the inner wall of the reaction tube 203. As illustrated in FIG. 7D, conical convex portions 203d are formed in the inner wall of the reaction tube 203. As illustrated in FIG. 7E, truncated conical convex portions 203e is formed in the inner wall of the reaction tube 203. Similarly, irregularities may be formed in the surface of the electrode 300.

The embodiments of the present disclosure have been concretely described above. However, the present disclosure is not limited to the above-described embodiments but may be modified in different ways without departing from the spirit and scope of the present disclosure.

Further, for example, in the above embodiments, the example in which the reactant is supplied after the supply of the precursor has been described. The present disclosure is not limited to such an aspect. For example, the order of supply of the precursor and the reactant may be reversed. That is to say, the precursor may be supplied after the supply of the reactant. By changing the supply order in this way, it is possible to change the quality and composition ratio of a film to be formed.

In the above-described embodiments and the like, the example in which the SiO film is formed on the wafer 200 has been described. However, the present disclosure is not limited to such an aspect but may be suitably applied to a case of forming a Si-based oxide film such as a silicon oxycarbide film (SiOC film), a silicon oxycarbonitride film (SiOCN film), a silicon oxynitride film (SiON film) or the like on the wafer 200.

For example, alternative to or in addition to the aforementioned gases, a nitrogen (N)-containing gas such as an ammonia ($NH_3$) gas, a carbon (C)-containing gas such as a propylene ($C_3H_6$) gas, a boron (B)-containing gas such as a boron trichloride ($BCl_3$) gas, or the like may be used to form, for example, a SiN film, a SiON film, a SiOCN film, a SiOC film, a SiCN film, a SiBN film, a SiBCN film, a BCN film, or the like. The order of flow of each gas may be changed as appropriate. Even when these films are formed, the same process conditions as in the above embodiments may be applied. This provides the same effects as those in the above embodiments. In these cases, the aforementioned reaction gas may be used as an oxidizing agent as the reaction gas.

In addition, the present disclosure can be suitably applied to a case of forming a metal-based oxide film or metal-based nitride film containing a metal element such as titanium (Ti), zirconium (Zr), hafnium (Hf), tantalum (Ta), niobium (Nb), aluminum (Al), molybdenum (Mo), tungsten or the like on the wafer 200. That is to say, the present disclosure can be suitably applied to a case of forming a TiO film, a TiOC film, a TiOCN film, a TiON film, a TiN film, a TiBN film, a TiBCN film, a ZrO film, a ZrOC film, a ZrOCN film, a ZrON film, a ZrN film, a ZrBN film, a ZrBCN film, an HfO film, an HfOC film, an HfOCN film, an HfON film, an HfN film, an HfBN film, an HfOCN film, a TaO film, a TaOC film, a TaOCN film, a TaON film, a TaN film, a TaBN film, a TaBCN film, an NbO film, an NbOC film, an NbOCN film, an NbON film, an NbN film, an NbBN film, an NbBCN film, an AlO film, an AlOC film, an AlOCN film, an AlON film, an AlN film, an AlBN film, an AlBCN film, an MoO film, an MoOC film, an MoOCN film, an MoON film, an MoN Film, an MoBN film, an MoBCN film, a WO film, a WOC film, a WOCN film, a WON film, a WN film, a WBN film, a WBCN film or the like on the wafer 200.

In these cases, for example, as the precursor gas, a tetrakis(dimethylamino)titanium ($Ti[N(CH_3)_2]_4$, abbreviation: TDMAT) gas, a tetrakis(ethylmethylamino)hafnium ($Hf[N(C_2H_5)(CH_3)]_4$, abbreviation: TEMAH) gas, a tetrakis(ethylmethylamino)zirconium ($Zr[N(C_2H_5)(CH_3)]_4$, abbreviation: TEMAZ) gas, a trimethylaluminum ($Al(CH_3)_3$, abbreviation: TMA) gas, a titanium tetrachloride ($TiCl_4$) gas, a hafnium tetrachloride ($HfCl_4$) gas or the like may be used.

That is to say, the present disclosure can be suitably applied to a case of forming a half-metal-based film containing a half-metal element, and a metal-based film containing a metal element. Film forming processes of these films have the same process procedures and process conditions as those described in the above embodiments and modifications. These cases provide the same effect as in the above embodiments.

Recipes used in the substrate processing process may be provided individually according to the process contents and may be stored in the memory device 121c via a telecommunication line or the external memory device 123. Moreover, at the start of a variety of processes, the CPU 121a may properly select an appropriate recipe from the recipes stored in the memory device 121c according to the process contents. Thus, it is possible for a single substrate processing apparatus to form thin films of different kinds, composition ratios, qualities and thicknesses for general purposes and with enhanced reproducibility. In addition, it is possible to reduce an operator's burden and to quickly start the variety of processes while avoiding an operation error.

The recipes mentioned above are not limited to newly-prepared ones but may be provided by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

According to the present disclosure in some embodiments, it is possible to provide a technique for facilitating a uniform substrate process.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
    a reaction tube with a process chamber defined therein, the process chamber being configured to process a substrate;
    a heating device installed outside the reaction tube and configured to heat the process chamber;
    a gas supply part installed inside the reaction tube and configured to supply a process gas used in processing the substrate;
    a plasma generating part including an electrode composed of a first electrode portion connected to a high frequency power supply and a second electrode portion grounded to earth, the first electrode portion and the second electrode portion being installed to be adjacent to each other and to surround an entire circumference of an outer wall of the reaction tube; and
    a controller configured to:
    set a frequency of a high frequency voltage of the high frequency power supply based on an inter-electrode distance between the first electrode portion and the second electrode portion, wherein a vibration amplitude of an electron in plasma corresponds to half of an electric force line of the high frequency voltage, the electric force line of the high frequency voltage being determined by connecting centers of the first electrode portion and the second electrode portion; and
    control the high frequency power supply to output the high frequency voltage having the set frequency.

2. The substrate processing apparatus of claim 1, wherein an inter-center distance between the centers of the first electrode portion and the second electrode portion which are adjacent to each other is twice or more of a thickness of a wall of the reaction tube.

3. The substrate processing apparatus of claim 2, wherein the inter-center distance between the centers of the first electrode portion and the second electrode portion which are adjacent to each other is twice or less a distance between a peripheral portion of the substrate and the outer wall of the reaction tube.

4. The substrate processing apparatus of claim 1, wherein an inter-center distance between the centers of the first electrode portion and the second electrode portion which are adjacent to each other falls within a range of 10 to 110 mm.

5. The substrate processing apparatus of claim 1, wherein the inter-electrode distance is a predetermined value in a range of half to twice of a value generated by equation 1:

$$\frac{\sqrt{eV/2m}}{\pi f}$$

where V is a voltage applied across the electrode and is preset to be in a range of 25 to 1,000 V,
f is the frequency of the high frequency power supply and is preset to be in a range of 2 to 60 MHz,
m is a mass of the electron, and
e/m is a specific charge of electrons.

6. The substrate processing apparatus of claim 5, wherein the inter-electrode distance is substantially equal to the value generated by equation 1.

7. The substrate processing apparatus of claim 1, wherein the gas supply part includes a gas nozzle installed inside the reaction tube that has at least one gas supply hole that is formed to face an inner wall of the reaction tube such that the process gas is supplied from the at least one gas supply hole toward the inner wall of the reaction tube.

8. The substrate processing apparatus of claim 7, wherein the reaction tube has irregularities formed in the inner wall of the reaction tube.

* * * * *